United States Patent
Frank et al.

(10) Patent No.: US 9,520,884 B2
(45) Date of Patent: Dec. 13, 2016

(54) PHASE LOCK LOOP WITH DYNAMIC LOCK RANGES

(71) Applicant: TEXAS INSTRUMENTS INCORPORATED, Dallas, TX (US)

(72) Inventors: Aaron L. Frank, Murphy, TX (US); Hamid R. Safiri, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/811,558

(22) Filed: Jul. 28, 2015

(65) Prior Publication Data

US 2016/0036453 A1    Feb. 4, 2016

Related U.S. Application Data

(60) Provisional application No. 62/032,237, filed on Aug. 1, 2014.

(51) Int. Cl.
*H03L 7/06*    (2006.01)
*H03L 7/099*   (2006.01)
*H03L 1/02*    (2006.01)

(52) U.S. Cl.
CPC ............. *H03L 7/099* (2013.01); *H03L 1/023* (2013.01)

(58) Field of Classification Search
CPC ................................. H03L 7/099; H03L 7/085

USPC ........ 327/156–159, 147–150, 378, 512, 513; 375/373–376; 331/1 R, 66, 176
See application file for complete search history.

(56) References Cited

U.S. PATENT DOCUMENTS

2013/0106476 A1* 5/2013 Joubert ................. H03L 1/00 327/156
2015/0180486 A1* 6/2015 Shanan ................. H03L 7/099 327/156

* cited by examiner

*Primary Examiner* — Lincoln Donovan
*Assistant Examiner* — Thomas Skibinski
(74) *Attorney, Agent, or Firm* — Tuenlap D. Chan; Frank D. Cimino (57) ABSTRACT

A phase look loop (PLL) device has a dynamic lock range that is based on a temperature measured during a calibration process. The PLL device includes a calibration circuit configured to receive a temperature reading corresponding to a junction temperature of the PLL device during the calibration process. Based on this temperature reading, the calibration circuit initiates a preset procedure that presets a control voltage of a voltage control oscillator in the PLL device. The preset procedure implements a calibration function defined by a slope with a numerator component and a denominator component. The numerator component corresponds to a range of the control voltage, whereas the denominator component corresponds to a range of ambient temperatures within which the PLL device operates.

20 Claims, 4 Drawing Sheets

PHASE LOCK LOOP WITH DYNAMIC LOCK RANGES

CROSS REFERENCE TO RELATED APPLICATIONS

Under 35 U.S.C. §119(e), this application claims the benefit of priority of U.S. Provisional Application 62/032,237 filed Aug. 1, 2014, which is hereby incorporated by reference in its entirety

BACKGROUND

Phase lock loop (PLL) circuits are used for generating oscillation signals in various devices. The range of frequencies, within which a PLL circuit can produce a locked output varies with the operation temperature of the PLL circuit. Accordingly, a PLL circuit may be unable to stay locked when the operation temperature fluctuates too much. To increase the lock range of a PLL circuit, attempts have been made in the past to increase the size of a varactor in the PLL circuit. However, a bigger varactor increases the loop gain of a voltage control oscillator, which leads to an increased amplitude-modulation (AM) to phase-modulation (PM) noise conversion. The increased AM-to-PM noise conversion creates more phase noise in the PLL circuit, which may impact the performance of the PLL circuit as well as the devices adopting the PLL circuit. Therefore, there is a need for a PLL circuit with a dynamic lock range under various temperature conditions.

SUMMARY

The present disclosure describes systems and techniques relating to a phase look loop (PLL) system that has a dynamic lock range based on a temperature measured during a calibration process. The PLL device generally includes a calibration circuit configured to receive a temperature reading corresponding to a junction temperature of the PLL device during the calibration process. Based on this temperature reading, the calibration circuit initiates a preset procedure that presets a control voltage of a voltage control oscillator in the PLL device. The preset procedure implements a calibration function defined by a slope with a numerator component and a denominator component. The numerator component corresponds to a range of the control voltage, whereas the denominator component corresponds to a range of ambient temperatures within which the PLL device operates.

In one implementation, a PLL system includes a PLL circuit, a temperature sensor, and a calibration circuit. The PLL circuit includes a voltage control oscillator (VCO), a frequency divider, and a detector circuit. The VCO is configured to receive a control voltage and generate an adjusted oscillation signal having a target frequency adjustable by the control voltage. The frequency divider is coupled with the VCO to receive the adjusted oscillation signal, and it is configured to generate a feedback oscillation signal by reducing the target frequency. The detector circuit is coupled between the frequency divider and the VCO. And the detector circuit is configured to detect a difference between the feedback oscillation signal and a reference oscillation signal. Based on this detection, the detector circuit is configured to generate the control voltage based on the difference. The calibration circuit is coupled with the temperature sensor and the detector circuit. During a calibration process, the temperature sensor is configured to generate a temperature reading corresponding to a junction temperature of the integrated circuit. In response, the calibration circuit is configured to override the detector circuit and preset the control voltage based on the temperature reading of the temperature sensor.

In another implementation, a PLL circuit includes a voltage control oscillator (VCO), a frequency divider, a detector circuit, and a calibration circuit. The VCO is configured to receive a control voltage and generate an adjusted oscillation signal having a target frequency adjustable by the control voltage. The frequency divider is coupled with the VCO to receive the adjusted oscillation signal, and it is configured to generate a feedback oscillation signal by reducing the target frequency. The detector circuit is coupled between the frequency divider and the VCO. And the detector circuit is configured to detect a difference between the feedback oscillation signal and a reference oscillation signal. Based on this detection, the detector circuit is configured to generate the control voltage based on the difference. The calibration circuit is coupled with the temperature sensor and the detector circuit. During a calibration process, the calibration circuit is configured to receive a temperature reading corresponding to a junction temperature of the PLL circuit. Based on this temperature reading, the calibration circuit is configured to preset the control voltage.

In yet another implementation, a method for calibrating a PLL device includes using a calibration circuit to receive a temperature reading corresponding to a junction temperature of the PLL device. The method also includes using the calibration circuit to determine an initial control voltage by applying the temperature reading to a function corresponding to a detector circuit of the PLL device and a range of ambient temperature within which the PLL circuit operates. The method further includes using a detector circuit to generate the initial control voltage for biasing a voltage control oscillator of the PLL device.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus; and apparatus implementations can be realized from a disclosed system, computer-readable medium, or method. Similarly, method implementations can be realized from a disclosed system, computer-readable medium, or apparatus; and system implementations can be realized from a disclosed method, computer-readable medium, or apparatus.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

Details of one or more implementations of the present disclosure are set forth in the accompanying drawings and the description below. Other features and advantages may be apparent from the description and drawings, and from the claims

DRAWING DESCRIPTIONS

Like reference symbols in the various drawings indicate like elements.

DETAILED DESCRIPTION

Figure 1:
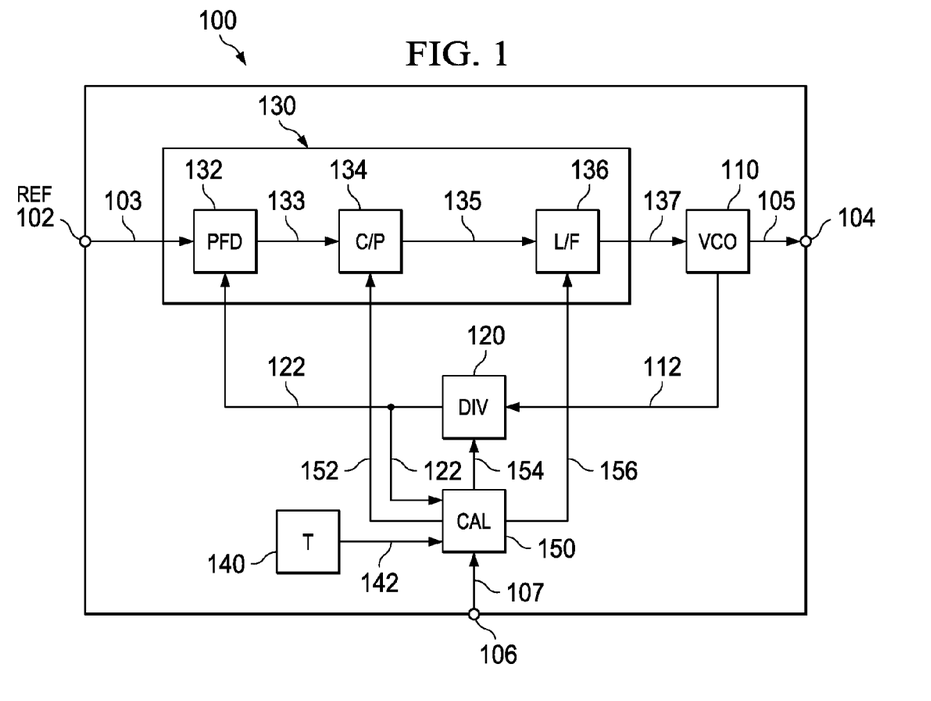
FIG. 1 shows a schematic view of an exemplary phase lock loop (PLL) system according to an implementation of the present disclosure.

FIG. 1 shows a schematic view of an exemplary phase lock loop (PLL) system 100 according to an implementation of the present disclosure. The PLL system 100 can be formed on a single integrated circuit alone or with other circuit components. The PLL system 100 can be adopted by a device that deploys the PLL features of the PLL system 100. The PLL system 100 can be accessed via a reference input port 102, a control input port 106, and a PLL output port 104. The PLL system 100 generally includes a voltage control oscillator (VCO) 110, a frequency divider 120, a detector circuit 130, and a calibration circuit 150. The PLL system 100 may optionally include a temperature sensor 140 for providing a temperature reading to the calibration circuit 150. Alternatively, the temperature sensor 140 can be incorporated outside of the PLL system 100, such that the temperature sensor 140 communicates with the calibration circuit 150 via the control input port 106.

When enabled, the VCO 110 receives several configuration settings, which include but are not limited to a control voltage 137. The VCO 110 is configured to generate an adjusted oscillation signal 112 that has a target frequency. When the PLL system 100 operates within its lock range, the target frequency is adjustable by the control voltage 137. Internally, the adjusted oscillation signal 112 is delivered to the frequency divider 120. Externally, the adjusted oscillation signal is delivered to the PLL output port 104 as an output oscillation signal 105. An external circuit component, which may include a local oscillation divider, can be used for stepping down the target frequency of the output oscillation signal 105.

The frequency divider 120 is coupled with the VCO 110 either directly or via additional circuit components. In a closed loop configuration, the frequency divider 120 receives the adjusted oscillation signal 112 from the VCO 110. The frequency divider 120 receives a division code (e.g., N) for dividing the target frequency of the adjusted oscillation signal 112. Based on the division code, the frequency divider 120 generates a feedback oscillation signal 122 having the divided frequency. The divided frequency typically reduces the target frequency because of the division operation of the frequency divider 120. In one implementation, for example, the frequency divider 120 may include a flip-flop circuit that registers the adjusted oscillation signal 112 at every Nth cycle of the adjusted oscillation signal 112. Thus, the resulting feedback oscillation signal 122 has a divided frequency that is a reduced version of the target frequency.

The division code serves as a digital control means for indirectly adjusting the target frequency of the adjusted oscillation signal 112. For instance, a larger division code yields a smaller divided frequency. The smaller divided frequency in turns drives the detector circuit 130 to increase the control voltage 137, which eventually tunes up the target frequency of the adjusted oscillation signal 112. In contrast, a smaller division code yields a larger divided frequency. The larger divided frequency in turns drives the detector circuit 130 to reduce the control voltage 137, which eventually tunes down the target frequency of the adjusted oscillation signal 112.

The detector circuit 130 is coupled between the frequency divider 120 and the VCO 110. When connected, the detector circuit 130 establishes a closed loop configuration with the VCO 110 and the frequency divider 120. In this closed loop configuration, the detector circuit 130 compares the feedback oscillation signal 122 with a reference oscillation signal 103 received from the reference input port 102. The reference oscillation signal 103 provides a reference frequency framework, such that the detector circuit 130 can adjust the control voltage 137 using this reference frequency framework.

In one implementation, for example, the detector circuit 130 detects a phase difference between the reference oscillation signal 103 and the feedback oscillation signal 122. When the phase difference is positive, meaning that the feedback oscillation signal 122 lags the reference oscillation signal 103, the detector circuit 130 will increase the control voltage 137 to speed up the adjusted oscillation signal 112. In contrast, when the phase difference is negative, meaning that the feedback oscillation signal 122 leads the reference oscillation signal 103, the detector circuit 130 will reduce the control voltage 137 to slow down the adjusted oscillation signal 112. Since the reference oscillation signal 103 typically remains constant, the feedback oscillation signal 122, which is generated by the frequency divider 120, indirectly controls the target frequency of the adjusted oscillation signal 112.

Consistent with the aforementioned description, the detector circuit 130 may include one or more circuit components. In one implementation, for example, the detector circuit 130 includes a phase frequency detector (PFD) 132, a charge pump 134, and a loop filter 136. The PFD 132 is coupled with the frequency divider 120 and the reference input port 102. When enabled, the PFD 132 receives the reference oscillation signal 103 and the feedback oscillation signal 122. The PFD 132 includes a comparison circuit that generates a phase difference signal 133 that has an active time period corresponds to the phase difference between the reference oscillation signal 103 and the feedback oscillation signal 122. In one implementation, for example, the phase difference signal 133 may have a first active time period signified by a first non-zero value (e.g., 1V) for as long as the reference oscillation signal 103 leads the feedback oscillation signal 122. In another implementation, for example, the phase difference signal 133 may have a second active time period signified by a second non-zero value (e.g., 2V or −1V) for as long as the reference oscillation signal 103 leads the feedback oscillation signal 122.

The charge pump 134 is coupled with the PFD 132 to receive the phase difference signal 133. When enabled, the charge pump 134 is configured to generate an amplification signal 135 based on the duration of the active time period of the phase difference signal 133. In general, the magnitude of the amplification signal 135 is proportional to the duration of the active time period, which represents the amount of phase difference between the reference oscillation signal 103 and the feedback oscillation signal 122. In one implementation, for example, the charge pump 134 may include a charging path and a discharging path, both of which are configured to adjust the voltage of the amplification signal 135. When the phase difference signal 133 indicates a phase lead of the reference oscillation signal 103, the charging path is activated to pump up the voltage of the amplification signal 135. On the other hand, when the phase difference signal 133 indicates a phase lag of the reference oscillation signal 103, the discharging path is activated to reduce the voltage of the amplification signal 135.

The loop filter 136 is coupled with the charge pump 134 to receive the amplification signal 135. When enable, the loop filter 136 is configured to generate the control voltage 137 for controlling the VCO 110. In general, the loop filter 136 includes resistive-capacitive (RC) elements to filter out the noise in the amplification signal 135 so that the VCO 110 will only respond when there is a difference between the reference oscillation signal 103 and the feedback oscillation signal 122. The loop filter 136 can be a passive loop filter (e.g., RC only circuit) or an active loop filter (e.g., operational amplifier with RC feedback).

Figure 2:
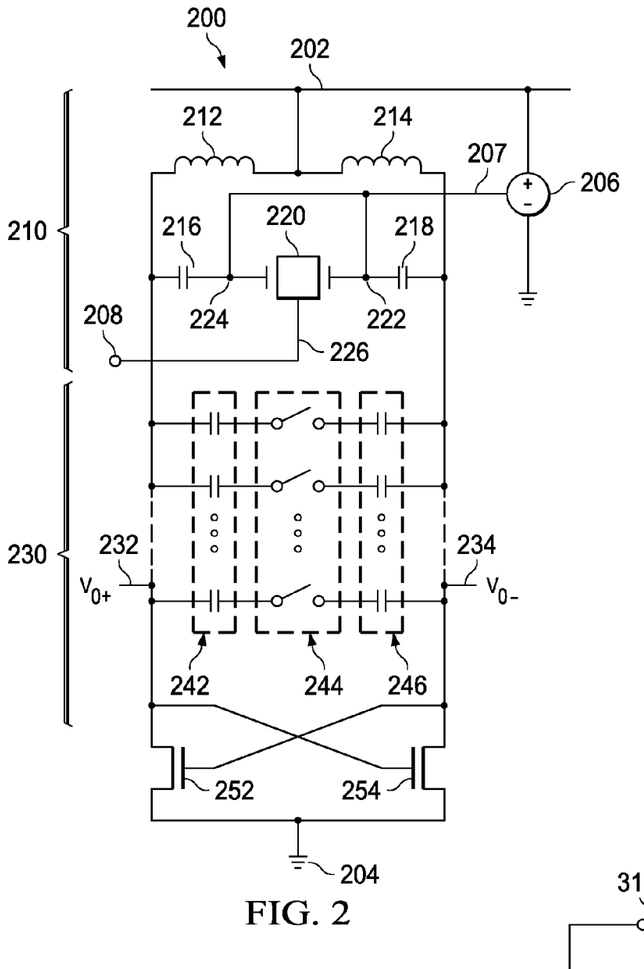
FIG. 2 shows a schematic view of an exemplary voltage control oscillator (VCO) according to an implementation of the present disclosure.

To further illustrate the operation of the VCO 110, FIG. 2 shows a schematic view of an exemplary VCO 200 according to an implementation of the present disclosure. The VCO 200 includes several inductive and capacitive (LC) components that define the target frequency of the adjusted oscillation signal 112. In general, the target frequency can be characterized as $1/(2\pi\sqrt{LC})$. The VCO 200 includes a dynamic adjustable circuit 210 and a preset adjustable circuit 230 for providing these LC components. The VCO 200 also includes a pair of cross coupled common-source (CS) amplifiers (e.g., a first CS transistor 252 and a second CS transistor 254) to form an oscillation ring that oscillates at the target frequency as defined by these LC components. The first and second CS transistors 252 and 254 share a common ground source 204. The common ground source 204 can be a ground source external to the PLL system 100 or an internal ground source tied to another transistor.

The dynamic adjustable circuit 210 includes a pair of inductors (e.g., a first inductor 212 and a second inductor 214), a pair of capacitors (e.g., a first capacitor 216 and a second capacitor 218), and a varactor 220. The first and second inductors 212 and 214 are connected in parallel to receive a power source 202 (e.g., VDD). The first and second capacitors 216 and 218 are connected in series with the varactor 220 to establish a capacitor chain in parallel with the pair of inductors 212 and 214. The capacitor chain allows a DC bias to be applied across the gate and body terminals of the varactor 220. This DC bias is independent of the voltage across the first and second differential outputs 232 and 234.

The varactor 220 includes a first gate terminal 222, a second gate terminal 224, and a body terminal 226. The first and second gate terminals 222 and 224 are coupled with a DC bias voltage source 206 to receive a DC gate bias voltage 207. The body terminal 226 is coupled with a control voltage input port 208 to receive the control voltage 137. In general, the varactor 220 provides a variable capacitance that is proportional to a potential difference between the gate bias voltage 207 and the control voltage 137. While the bias voltage 207 remains unchanged, the variable capacitance is tunable by the control voltage 137. The varactor 220 can be implemented by a pair of MOSFET transistors (e.g., NMOS transistors) having common drain electrodes and common source electrodes. The body electrodes of the MOSFET transistors are tied to body terminal 226 for receiving the control voltage 137, whereas the gate electrodes of the MOSFET transistors are tied to the first and second gate terminals for receiving the gate bias voltage 207.

The preset adjustable circuit 230 includes a first group of large capacitors 242, a second group of large capacitors 246, and a group of switches 244. The group of switches 244 is used for selecting one or more pair of large capacitors from the first and second groups of large capacitors 242 and 246. During a calibration process of the PLL system 100, the calibration circuit 150 is configured to close one or more switches in the group of switches 244. As a result, the large capacitors from the first and second groups of large capacitors 242 and 246 can be added to the capacitor ladder below the dynamic adjustable circuit 210. Unlike the dynamic adjustable circuit 210, the preset adjustable circuit 230 is not an active part of the closed loop feedback mechanism. After the calibration process, the capacitance provided by the preset adjustable circuit 230 is fixed, and thus remains unchanged, during closed loop operations.

The VCO 200 includes a first differential output 232 and a second differential output 234. The first differential output 232 is coupled to the drain electrode of the first CS transistor 252 and the gate electrode of the second CS transistor 254. The second differential output 234 is coupled to the drain electrode of the second CS transistor 254 and the gate electrode of the first CS transistor 252. Together, the first and second differential outputs 232 and 234 deliver the adjusted oscillation signal 112. The target frequency of the adjusted oscillation signal 112 is in part defined by the fixed capacitance of the preset adjustable circuit 230 and in part defined by the adjustable capacitance of the dynamic adjustable circuit 210.

The dynamic adjustable circuit 210 is an active part of the closed loop feedback mechanism because the varactor 220 is responsive to the control voltage 137, which is generated as a result of a closed loop feedback. Similar to the preset adjustable circuit 230, the dynamic circuit 210 is also a part of the open loop preset mechanism because the varactor 220 can be biased at a particular gate-to-body voltage ($V_{GB}$) before the loop is closed. The initial bias voltage (e.g., $V_{GB}$) can be used for defining the lock range of the PLL system 100 during closed loop operations.

Figure 4:
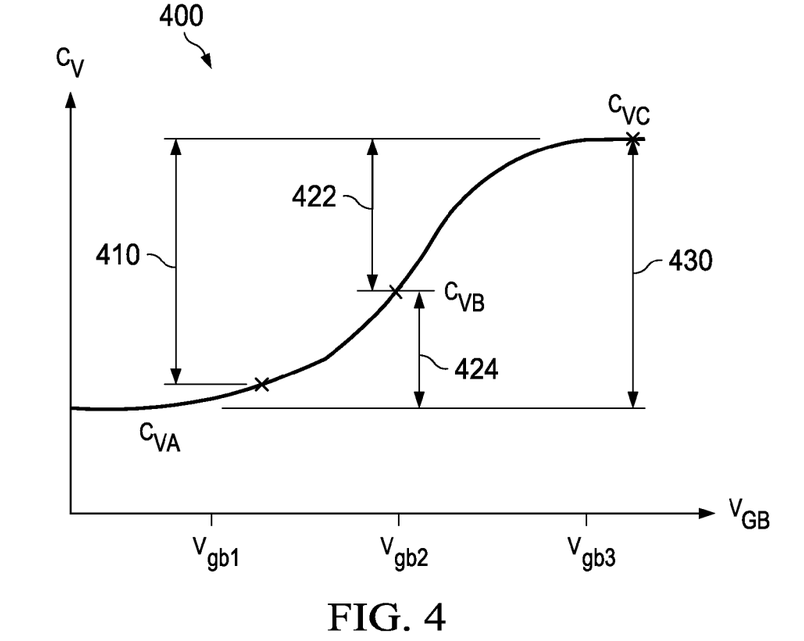
FIG. 4 shows an exemplary varactor capacitance transition diagram according to an implementation of the present disclosure.

FIG. 4 shows an exemplary varactor capacitance transition diagram 400 according to an implementation of the present disclosure. The varactor capacitor transition diagram 400 illustrates a varactor (e.g., the varactor 220) has a change in varactor capacitance (Cv) in response to a change of gate-to-body voltage ($V_{GB}$). Typically, one would preset an initial $V_{GB}$ that biases the varactor (e.g., 220) around the mid-rail region (e.g., $C_{CB}$ and $V_{gb2}$) to allow a moderate capacitance up-swing 422 as well as a moderate capacitance down-swing 424. This biasing scheme is used when the junction temperature of the PLL circuit (e.g., 100) is not known during the calibration process.

When the junction temperature decreases during the closed loop operation, the closed loop target frequency will increase. To compensate the up-drift in target frequency, the varactor capacitance Cv is increased (see, e.g., moderate capacitance up-swing 422) by reducing the control voltage (i.e., a high $V_{GB}$ where $V_G$ remains constant). On the other hand, when the junction temperature increases during the closed loop operation, the closed loop target frequency will decreases. To compensate the down-drift in target frequency, the varactor capacitance Cv is decreased (see, e.g., moderate capacitance down-swing 424) by increasing the control voltage (i.e., a low $V_{GB}$ where $V_G$ remains constant).

This mid-rail biasing scheme works well when the PLL circuit operates within a moderate range of temperatures. For more extreme temperature ranges (e.g., from −40 degree Celsius to 90 degree Celsius) however, this mid-rail biasing scheme may have a hard time in providing sufficient up-swing and down-swing capacitance adjustment without substantially increasing the size of the varactor (e.g., 220). Recognizing this tradeoff, the present disclosure provides a temperature-dependent biasing scheme that helps maximize the closed loop adjustability of the varactor without having to increase the size of the varactor.

In one implementation, for example, the calibration circuit 150 (see FIG. 1) is configured to preset the control voltage 137 to reduce the initial variable capacitance when the initial junction temperature of the PLL system 100 is above a predetermined threshold. The predetermined threshold can be set as the average junction temperature of the PLL system 100. For instance, if the PLL system 100 is expected to operate between −40 degree Celsius and 90 degree Celsius, the predetermined threshold can be 65 degree Celsius. When the junction temperature of the PLL system 100 starts off high (i.e., above the predetermined threshold), it is likely that the PLL system 100 may experience a greater drop, rather than rise, in junction temperature during closed loop operations. This means the target frequency is likely to increase in greater magnitude than it will otherwise decrease. To account for this lopsided frequency shift, the calibration circuit 150 presets the initial variable capacitance at a low value (e.g., $C_{VA}$). This low initial variable capacitance (e.g., $C_{VA}$) allows a high capacitance up-swing 410, which maximizes the closed loop adjustability of the varactor without having to increase the size of the varactor.

In another implementation, for example, the calibration circuit 150 (see FIG. 1) is configured to preset the control voltage 137 to increase the initial variable capacitance when the initial junction temperature of the PLL system 100 is below a predetermined threshold. Again, the predetermined threshold can be set as the average junction temperature of the PLL system 100. For instance, if the PLL system 100 is expected to operate between −40 degree Celsius and 90 degree Celsius, the predetermined threshold can be 65 degree Celsius. When the junction temperature of the PLL system 100 starts off low (i.e., below the predetermined threshold), it is likely that the PLL system 100 may experience a greater rise, rather than drop, in junction temperature during closed loop operations. This means that the target frequency is likely to decrease in greater magnitude than it will otherwise increase. To account for this lopsided frequency shift, the calibration circuit 150 presets the initial variable capacitance at a high value (e.g., $C_{VC}$). This low high variable capacitance (e.g., $C_{VC}$) allows a high capacitance down-swing 430, which maximizes the closed loop adjustability of the varactor without having to increase the size of the varactor.

Referring again to FIG. 1, the temperature sensor 140 is configured to generate a temperature reading signal 142 during the calibration process. The temperature reading signal 142 includes one or more temperature readings corresponding to a junction temperature of the PLL system 100. In one implementation, the temperature sensor 140 can be placed in an integrated circuit on which the PLL system 100 is formed. For example, the temperature sensor 140 can be placed adjacent to a temperature sensitive area of the PLL system 100, which includes the VCO 110. In another implementation, the temperature sensor 140 can be placed outside of the PLL system 100 provided that the device which incorporates the PLL system 100 has good thermal conductivity. For instance, the temperature sensor 140 can be placed on a printed circuit board as a discrete component. In that case, the PLL system 100 is configured to receive the temperature reading signal 142 via the control input port 106.

The calibration circuit 150 is coupled with the temperature sensor 140 to receive the temperature reading signal 142. The calibration circuit 150 is also coupled with frequency divider 120 and the detector circuit 130 for coordinating and controlling the calibration process. Specifically, the calibration circuit 150 is configured to override the detector circuit 130 and preset the control voltage 137 based on the temperature reading of the temperature reading signal 142 during the calibration process of the PLL system 100. To initiate the calibration process, the calibration circuit 150 breaks open the closed loop configuration of the PLL system 100. In one implementation, the calibration circuit 150 may break open the closed loop configuration by disabling the charge pump 134. More specifically, the calibration circuit 150 is configured to generate a charge pump control signal 152 for controlling the operations of the charge pump 134. The charge pump control signal 152 is used for enabling and disabling the charge pump 134.

Figure 5:
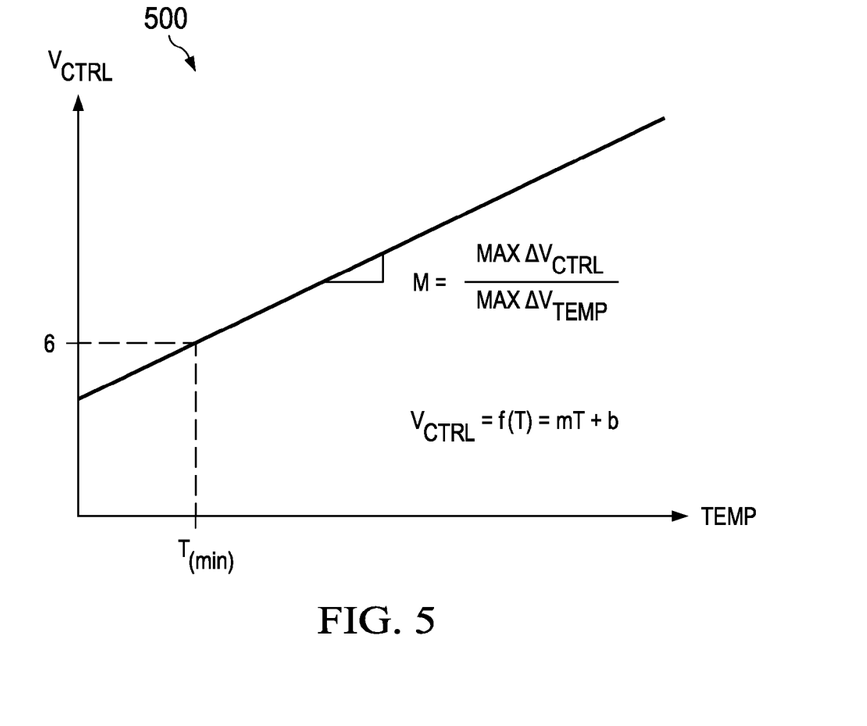
FIG. 5 shows an exemplary varactor adjustment function diagram according to an implementation of the present disclosure.

After the calibration circuit 150 creates an open loop configuration, the calibration circuit 150 is configured to preset the control voltage 137 based on a linear function of the temperature reading. Referring to FIG. 5, the linear function f(T) returns a value of the control voltage 137 ($V_{CTRL}$) based on the temperature reading (T) carried by the temperature reading signal 142. More precisely, the linear function f(T) can be expressed as f(T)=m*T+b. In one implementation, the linear function f(T) is defined by a slope (m) having: a numerator that corresponds to an output range of the detector circuit 130; and a denominator corresponding to a range of ambient temperatures within which the PLL system 100 operates.

For instance, if the output range of the detector circuit 130 is from 3V to 0V, then the numerator of slope (m) is 3V; and if the range of ambient temperatures is from 90 degree Celsius to −40 degree Celsius, then the denominator of the slope (m) is 130 degrees Celsius. Together, the numerator and the denominator define the slope (m) as 0.023 V/° C. In an alternative implementation, the numerator may correspond to the input range of control voltage 137 to the VCO 110. Because the control voltage ($V_{CTRL}$) directly impact the gate-to-body bias ($V_{GB}$) of the varactor (e.g., 220), the input range of the control voltage ($V_{CTRL}$) correlates to a full range access to the maximum capacitance swing (e.g., up-swing 422 plus down-swing 424) of the varactor. To that end, the slope (m) serves as a direct correlator between the varactor capacitance (i.e., Cv) and the operating temperature of the PLL system 100.

The linear function f(T) also includes a constant value (b) defined by a minimum control voltage 137 and the slope (m) at a minimum temperature at which the PLL system 100 is expected to operate. This minimum temperature can be the temperature reading generated by the temperature sensor 140 while the PLL system 100 is subjected to the minimum expected ambient temperature. Alternatively, this minimum temperature can be an estimated junction temperature of the PLL system 100 while the PLL system 100 is subjected to the minimum expected ambient temperature. For illustration, it can be assumed that the slope (m) has a value of 0.023 VPC, the minimum control voltage is 0.15V, and the minimum ambient temperature is −40 degree Celsius. Under this assumption, the constant value (b) equals $V_{CTRL}(min)-m*T(min)=1.07V$.

Thus, if the temperature reading presented in the temperature reading signal 142 is 50 degrees Celsius and the linear function f(T) is defined as 0.023*T+1.07V, then the calibration circuit 150 will determine the preset control voltage ($V_{CTRL}$) 137 by solving the linear function f(T) with the known temperature reading of 50 degree Celsius. In that case, the preset control voltage 137 is determined to be 2.22V. The calibration circuit 150 may include a digital-to-analog converter (DAC) circuit that generates the preset control voltage ($V_{CTRL}$). The calibration circuit 150 may include the preset control voltage ($V_{CTRL}$) in a loop filter control signal 156 and deliver the preset control voltage to the loop filter 136. In turns, the loop filter 136 generates the control voltage 137 according to the loop filter control signal 156.

Figure 3:
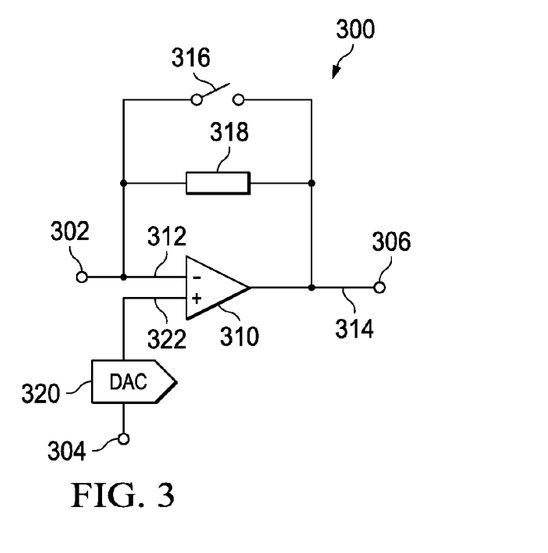
FIG. 3 shows a schematic view of an exemplary active loop filter according to an implementation of the present disclosure.

Alternatively, in the event that the loop filter 136 is an active loop filter, the calibration circuit 150 may adjust a reference circuit of the active loop filter so as to direct the delivery of the preset control voltage ($V_{CTRL}$) 137. For example, FIG. 3 shows a schematic view of an exemplary active loop filter 300 according to an implementation of the present disclosure. The active loop filter 300 includes an operational amplifier (op amp) 310, a filter circuit 318, a switch 316, and a DAC circuit 320. The op amp 310 includes a negative input terminal for receiving an input signal 312, and a positive input terminal for receiving a reference signal 322. When enabled, the op amp 310 is configured to generate an output signal 314 based on a comparison of the input signal 312 against the reference signal 322. For instance, if the input signal 312 is less than the reference signal 322, the op amp 310 will increase the voltage level of the output signal 314. On the other hand, if the input signal 312 is greater than the reference signal 322, the op amp 310 will reduce the voltage level of the output signal 314. The output signal 314 is delivered to the output port 306, which is typically coupled with the VCO 110 as shown in FIG. 1.

In a closed loop configuration, the switch 316 is open such that op amp 310 receives the input signal 312 from an input port 302, which is typically coupled with the output of the charge pump 134 as shown in FIG. 1. As such, the op amp 310 receives from the input port 302 the amplification signal 135 from the charge pump 134. The op amp 310 compares the amplification signal 135 with the reference signal 322, and the op amp 310 generates the output signal 314 based on this comparison. To that end, the op amp 310 further amplifies the detected difference between the feedback oscillation signal 122 and the reference oscillation signal 103. The op amp 310 generates the control voltage 137 that varies within the output range of the op amp 310 and based on the amplified difference (i.e., the amplification signal 135). Moreover, the filter circuit 318 provides a feedback path from the output signal 314 back to the negative input terminal of the op amp 310. The filter circuit 318 includes one or more resistive-capacitive components for reducing or dampening the noise of the PLL system 100.

In an open loop configuration, the switch 316 is closed such that the negative terminal of the op amp 310 receives a direct feedback from the output signal 314. The calibration circuit 150 can be used for controlling the switch 316 during the calibration process when the charge pump 134 is disabled. Specifically, the calibration circuit 150 overrides the detector circuit 130 by redirecting the input of the op amp 310 to receive the control voltage 137 delivered at the output port 306 during only the calibration process. As a result, the voltage level of the output signal 314 can be adjusted directly by the DAC 320. In order to preset the control voltage 137 of the VCO 110, the calibration circuit 150 sends a loop filter control signal 156 to the active loop filter 300 via the reference control input port 304. The loop filter control signal 156 includes a digital code for selecting an analog voltage level provided by the DAC 320.

The positive terminal of the op amp 310 receives the selected analog voltage level from the DAC 320. In response, the op amp 310 generates the output signal 314 bearing the selected analog voltage level. This selected analog voltage level is the same as, or can be an approximation of, the preset control voltage ($V_{CTRL}$) determined under the linear function f(T) as previously described. The approximation is based on the available voltage levels provided by the DAC 320. For instance, if the preset control voltage ($V_{CTRL}$) is determined to the 2.22 V, the selected analog voltage can be 2.20V provided that the DAC 320 has a 0.10 V increment between successive analog voltage levels.

After adjusting the VCO 110 with the preset control voltage ($V_{CTRL}$) 137, the calibration circuit 150 receives the feedback oscillation signal 122 from the frequency divider 120. The calibration circuit 150 compares the frequency of the feedback oscillation signal 122 with a reference frequency approximating the frequency of the reference oscillation signal 103. Based on this comparison, the calibration circuit 150 generates a divider control signal 154 that carries a division code for adjusting the frequency dividing operation of the frequency divider 120. The calibration circuit 150 repeats this feedback-compare-adjust cycle until the frequency of the feedback frequency signal 122 matches with the frequency of the reference oscillation signal 103. At that point, the calibration circuit 150 may conclude the calibration process. The calibration circuit 150 then transforms the PLL system 100 form the open loop configuration to the closed loop configuration. In one implementation, for example, the calibration circuit 150 is configured to enable the charge pump 134 and open the switch 316 of the active loop filter 300.

The aforementioned operations of the PLL system 100 can be initiated and performed by the hardware components of the PLL system 100. Specifically, one or more tasks of the calibration process can be performed as a method prescribed by software instructions and/or firmware logics. These software instructions and/or firmware logics are stored or installed in the calibration circuit 150, which can be a microprocessor or a digital state machine. For software implementation, the calibration circuit 150 includes a processing circuit and a memory device. The memory device is used for storing these software instructions, whereas the processing circuit is used for executing these software instructions.

Figure 6:
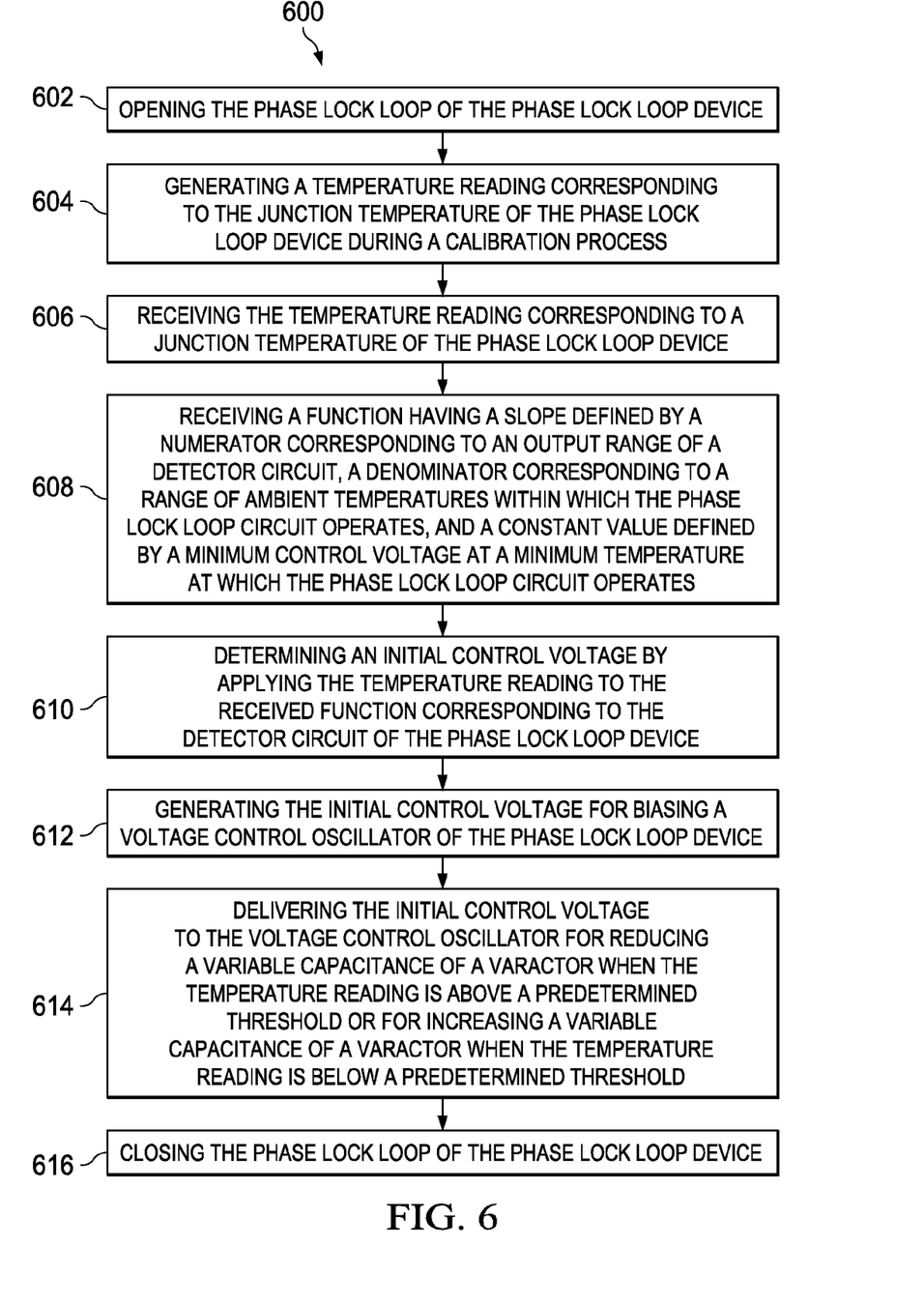
FIG. 6 shows a flow chart of an exemplary method for calibrating a PLL device according to an implementation of the present disclosure.

FIG. 6 shows a flow chart of an exemplary method 600 for calibrating a PLL device (e.g., the PLL system 100) according to an implementation of the present disclosure. The calibration method 600 starts at step 602, which includes opening the phase lock loop (PLL) of the PLL device. Consistent with the description of FIGS. 1-5, step 602 can be performed by the calibration circuit 150 and the detector circuit 130.

After step 602, the method 600 proceeds to step 604, which includes generating a temperature reading corresponding to the junction temperature of the PLL device during a calibration process. Consistent with the description of FIGS. 1-5, step 604 can be performed by the temperature sensor 140 under the instruction of the calibration circuit 150.

After step 604, the method 600 proceeds to step 606, which includes receiving the temperature reading corresponding to a junction temperature of the PLL device. Consistent with the description of FIGS. 1-5, step 606 can be performed by the calibration circuit 150.

After step 606, the method 600 proceeds to step 608, which includes receiving a function having a slope and a constant. The received function can be generated by the calibration circuit 150 using the temperature reading. Alternatively, the received function can be partially defined by and stored in the calibration circuit 150. The slope of the received function is defined by a numerator and a denominator. The numerator corresponds to an output range of a detector circuit, such as the detector circuit 130, whereas the denominator corresponds to a range of ambient temperatures at which the PLL circuit operates. The constant value of the received function is defined by a minimum control voltage at a minimum temperature at which the PLL device operates. Consistent with the description of FIGS. 1-5, step 608 can be performed by the calibration circuit 150. In addition to receiving the function, step 608 may include deriving the function using the parameters described herein.

After step 608, the method 600 proceeds to step 610, which includes determining an initial control voltage ($V_{CTRL}$) by applying the temperature reading to the received function corresponding to the detector circuit of the PLL device. Consistent with the description of FIGS. 1-5, step 610 can be performed by the calibration circuit 150.

After step 610, the method 600 proceeds to step 612, which includes generating the initial control voltage ($V_{CTRL}$) for biasing a voltage control oscillator (e.g. the VCO 110) of the PLL device. Consistent with the description of FIGS. 1-5, step 612 can be performed by the calibration circuit 150 and optionally, the active loop filter 300.

After step 612, the method 600 proceeds to step 614, which includes delivering the initial control voltage to the VCO. The delivered initial control voltage is used for reducing a variable capacitance of a varactor (e.g., the varactor 220) when the temperature reading is above a predetermined threshold. Alternatively, the delivered initial control voltage is used for increasing a variable capacitance of the varactor when the temperature reading is below a predetermined threshold. The predetermined threshold can be an average temperature of a range of ambient temperatures within which the PLL device is expected to operate. Consistent with the description of FIGS. 1-5, step 614 can be performed by the calibration circuit 150 and the loop filter 136.

After step 614, the method 600 proceeds to step 616, which includes closing the PLL of the PLL device. Consistent with the description of FIGS. 1-5, step 616 can be performed by the calibration circuit 150, the frequency divider 120, and the charge pump 134. Upon completing step 616, the method 600 is concluded.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the methods and/or operations described (such as a program encoded in a computer-readable medium, which can be a memory device, a storage device, a machine-readable storage substrate, or other physical, machine-readable medium, or a combination of one or more of them).

The term "apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a standalone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A system comprising:
   a phase lock loop (PLL) circuit including:
      a voltage control oscillator (VCO) configured to receive a control voltage and generate an adjusted oscillation signal having a target frequency adjustable by the control voltage;
      a frequency divider coupled with the VCO to receive the adjusted oscillation signal, the frequency divider configured to generate a feedback oscillation signal by reducing the target frequency; and
      a detector circuit coupled between the frequency divider and the VCO, the detector circuit configured to detect a difference between the feedback oscillation signal and a reference oscillation signal, and configured to generate the control voltage based on the difference;
   a temperature sensor configured to generate a temperature reading corresponding to a junction temperature of the PLL circuit; and
   a calibration circuit coupled with the temperature sensor and the detector circuit, the calibration circuit configured to override the detector circuit and preset the control voltage based on the temperature reading during a calibration procedure of the PLL circuit.

2. The system of claim 1, wherein:
   the calibration circuit is configured to preset the control voltage based on a linear function of the temperature reading; and
   the linear function is defined by a slope having a numerator corresponding to an output range of the detector circuit.

3. The system of claim 1, wherein:
   the calibration circuit is configured to preset the control voltage based on a linear function of the temperature reading; and
   the linear function is defined by a slope having a denominator corresponding to a range of ambient temperatures within which the PLL circuit operates.

4. The system of claim 1, wherein:
   the calibration circuit is configured to preset the control voltage based on a linear function of the temperature reading; and
   the linear function includes a constant value defined by a minimum control voltage at a minimum temperature at which the PLL circuit operates.

5. The system of claim 1, wherein:
   the detector circuit includes an amplifier configured to amplify the detected difference between the feedback oscillation signal and the reference oscillation signal; and
   the amplifier is configured to generate the control voltage varying within an output range based on the amplified difference.

6. The system of claim 1, wherein:
   the detector circuit includes an amplifier having an input for receiving the detected difference and an output for delivering the control voltage based on the detected difference; and
   the calibration circuit is configured to override the detector circuit by redirecting the input of the amplifier to receive the control voltage delivered at the output of the amplifier during only the calibration procedure.

7. The system of claim 1, wherein:
   the VCO includes a varactor having a variable capacitance tunable by the control voltage for adjusting the target frequency; and
   the calibration circuit is configured to preset the control voltage to reduce the variable capacitance when the temperature reading is above a predetermined threshold.

8. The system of claim 1, wherein:
   the VCO includes a varactor having a variable capacitance tunable by the control voltage for adjusting the target frequency; and
   the calibration circuit is configured to preset the control voltage to increase the variable capacitance when the temperature reading is below a predetermined threshold.

9. A phase lock loop (PLL) circuit, comprising:
   a voltage control oscillator (VCO) configured to receive a control voltage and generate an adjusted oscillation signal having a target frequency adjustable by the control voltage;
   a frequency divider coupled with the VCO to receive the adjusted oscillation signal, the frequency divider configured to generate a feedback oscillation signal by reducing the target frequency;
   a detector circuit coupled between the frequency divider and the VCO, the detector circuit configured to detect a difference between the feedback oscillation signal and a reference oscillation signal, and configured to generate the control voltage based on the difference; and
   a calibration circuit coupled with the detector circuit, the calibration circuit configured to receive a temperature reading corresponding to a junction temperature of the PLL circuit, the calibration circuit configured to preset the control voltage based on the temperature reading during a calibration procedure of the PLL circuit.

10. The PLL circuit of claim 9, wherein:
    the calibration circuit is configured to preset the control voltage based on a linear function of the temperature reading; and
    the linear function is defined by a slope having a numerator corresponding to an output range of the detector circuit.

11. The PLL circuit of claim 9, wherein:
    the calibration circuit is configured to preset the control voltage based on a linear function of the temperature reading; and
    the linear function is defined by a slope having a denominator corresponding to a range of ambient temperatures within which the PLL circuit operates.

12. The PLL circuit of claim 9, wherein:
    the calibration circuit is configured to preset the control voltage based on a linear function of the temperature reading; and
    the linear function includes a constant value defined by a minimum control voltage at a minimum temperature at which the PLL circuit operates.

13. The PLL circuit of claim 9, wherein:
    the VCO includes a varactor having a variable capacitance tunable by the control voltage for adjusting the target frequency; and the calibration circuit is configured to preset the control voltage to reduce the variable capacitance when the temperature reading is above a predetermined threshold.

14. The PLL circuit of claim 9, wherein:
the VCO includes a varactor having a variable capacitance tunable by the control voltage for adjusting the target frequency; and
the calibration circuit is configured to preset the control voltage to increase the variable capacitance when the temperature reading is below a predetermined threshold.

15. A method for calibrating a phase lock loop (PLL) device, the method comprising:
receiving, by a calibration circuit, a temperature reading corresponding to a junction temperature of the PLL device;
determining, by the calibration circuit, an initial control voltage by applying the temperature reading to a function corresponding to a detector circuit of the PLL device and a range of ambient temperatures within which the PLL circuit operates; and
generating, by the detector circuit, the initial control voltage for biasing a voltage control oscillator (VCO) of the PLL device.

16. The method of claim 15, further comprising:
generating, by a temperature sensor, the temperature reading corresponding to the junction temperature of the PLL device during a calibration process.

17. The method of claim 15, further comprising:
receiving, by the calibration circuit, the function having a slope defined by:
a numerator corresponding to an output range of the detector circuit; and
a denominator corresponding to the range of ambient temperatures within which the PLL circuit operates.

18. The method of claim 15, further comprising:
receiving, by the calibration circuit, the function having a constant value defined by a minimum control voltage at a minimum temperature at which the PLL circuit operates.

19. The method of claim 15, further comprising:
delivering, by the detector circuit, the initial control voltage to the VCO for reducing a variable capacitance of a varactor when the temperature reading is above a predetermined threshold.

20. The method of claim 15, further comprising:
delivering, by the detector circuit, the initial control voltage to the VCO for increasing a variable capacitance of a varactor when the temperature reading is below a predetermined threshold.

* * * * *